United States Patent [19]

Tobise et al.

[11] 4,056,767
[45] Nov. 1, 1977

[54] COOLING ARRANGEMENT FOR SEMICONDUCTOR CONVERTER DEVICE

[75] Inventors: Masahiro Tobise; Hiromasa Kogure; Tadahiko Kanbara; Hiroshi Koseki, all of Ibaraki, Japan

[73] Assignee: Hitachi, Ltd., Japan

[21] Appl. No.: 717,387

[22] Filed: Aug. 24, 1976

[30] Foreign Application Priority Data

Aug. 25, 1975 Japan .................................. 50-102153

[51] Int. Cl.² ............................................ H02M 7/00
[52] U.S. Cl. ..................................... 363/141; 363/63; 363/129
[58] Field of Search ..................... 318/280, 293; 321/8, 321/8 C; 357/81

[56] References Cited

U.S. PATENT DOCUMENTS

| 3,400,307 | 9/1968 | Baker et al. ........................... 357/81 |
| 3,502,956 | 3/1970 | Fries et al. ........................... 321/8 R |

FOREIGN PATENT DOCUMENTS

| 2,448,186 | 4/1975 | Germany ............................... 357/81 |

*Primary Examiner*—William M. Shoop
*Attorney, Agent, or Firm*—Craig & Antonelli

[57] ABSTRACT

In a converting device having two sets of converters, each of which includes planar type semiconductor controlled rectifier elements connected in a bridge configuration, with the converters being connected to a load, in a reverse-parallel configuration, so that the anode of one element is connected to the cathode of its parallel connected element, cooling fins are interposed between the planar type semiconductor controlled rectifier elements so that an individual cooling fin serves to cool directly adjacent elements disposed along the same axis in series with each other. As a result, the number of cooling fins can be sharply reduced. The converting device is especially effective for normal and reverse switching operations of a d.c. motor.

4 Claims, 12 Drawing Figures

FROM FEW HOUR

COOLING ARRANGEMENT FOR SEMICONDUCTOR CONVERTER DEVICE

BACKGROUND OF THE INVENTION

For the purpose of cooling a planar-type semiconductor controlled rectifier element, a pair of cooling fins are normally disposed on opposite ends of the element so that both surfaces of the element are cooled by the fins. In a converting device wherein a plurality of such semiconductor controlled rectifier elements are employed, a large number of these cooling devices is required. A typical example of such a cooling device is disclosed in U.S. Pat. No. 3,457,472 and a circuit configuration in which such a cooling device is employed is illustrated in FIG. 1a of the accompanying drawings.

FIG. 1a is an illustration of a prior-art circuit for effecting reversible operation of a d.c. motor. The motor 73 has a field winding 74 and is connected to a converter circuit including thyristors 11 through 16, reverse thyristors 21 through 26, capacitors 31 through 36, resistors 41 through 46, anode reactor elements 51 through 56, fuse elements 61 through 68, a forward gate control circuit 71, a reverse gate control circuit 72 and power source lines U, V and W.

For an individual thryistor, such as thyristor 11, there are provided a pair of cooling fins 81 and 82, more specifically shown in FIG. 1b. The cooling arrangement also includes metal fittings 91 and 92, insulator elements 93 and 94 and a spring 95. Thus, for each thyristor or semiconductor controlled rectifier element, a pair of cooling fins is provided.

These cooling fins are required for proper operation of the circuit since current flow through the circuit in both the forward and reverse directions may take place over intervals of several seconds to several hours, as illustrated in FIGS. 2a and 2b. This means that the utilization factor of the cooling fins is 50%.

It has also been proposed to simultaneously clamp thyristors 11 and 12 by a pair of cooling fins so as to enhance the utilization factor of the cooling fins. However, because of the dimensional tolerance of the thickness of the thyristors, this proposal has not been achieved in practice. As a result, cooling fins are disposed independently for each respective thyristor which necessarily means that a large number of cooling fins are required.

SUMMARY OF THE INVENTION

In view of the above-described disadvantages of the prior art, the present invention has been developed and provides an arrangement which permits the number of cooling fins required for proper operation of the converter device to be significantly reduced. Although the bridge-connected circuit is usually a three-phase circuit, it may be a single-phase circuit or a multi-phase circuit such as a twelve-phase circuit. Of significance is the employment of two or mre sets of series elements with semiconductor controlled rectifier elements connected in series in accordance with the number of phases of the circuit, and the mid-point of the series connected elements being connected to an A.C. source, while the A.C. side of the series elements is connected to a load.

The bridge-connected circuit forms a converter circuit which operates as a rectifier and as an inverter by controlling the application of gate signals to the element. The invention is applicable to a converter circuit in which two sets of such converters are connected to a load in parallel and in opposite polarity to one another. A typical example of a load for the circuit is a d.c. motor which is normally or reversely driven by alternately swtiching and operating the two sets of converter circuits.

In accordance with the present invention, the converter circuits are connected in parallel and in opposite polarities and the controlled rectifier elements are arranged and connected in series along the same axis so that cooling fins are interposed between adjacent electrodes of mutually opposite polarities of adjacent semiconductor rectifier elements which belong to respectively different converters. As a result of the construction, the number of cooling fins required for cooling the converter circuit can be sharply reduced. For example, in a circuit such as that shown in FIG. 1a, wherein 24 individual cooling fins are normally required, in accordance with the present invention, the number can be reduced to 14 or 15 while maintaining the same operational performance of the circuit.

BRIEF DESCRIPTION OF THE DRAWINGS

FIGS. 2a and 2b show typical switching operations for the circuit shown in FIG. 1a;

DETAILED DESCRIPTION

Figure 1A:
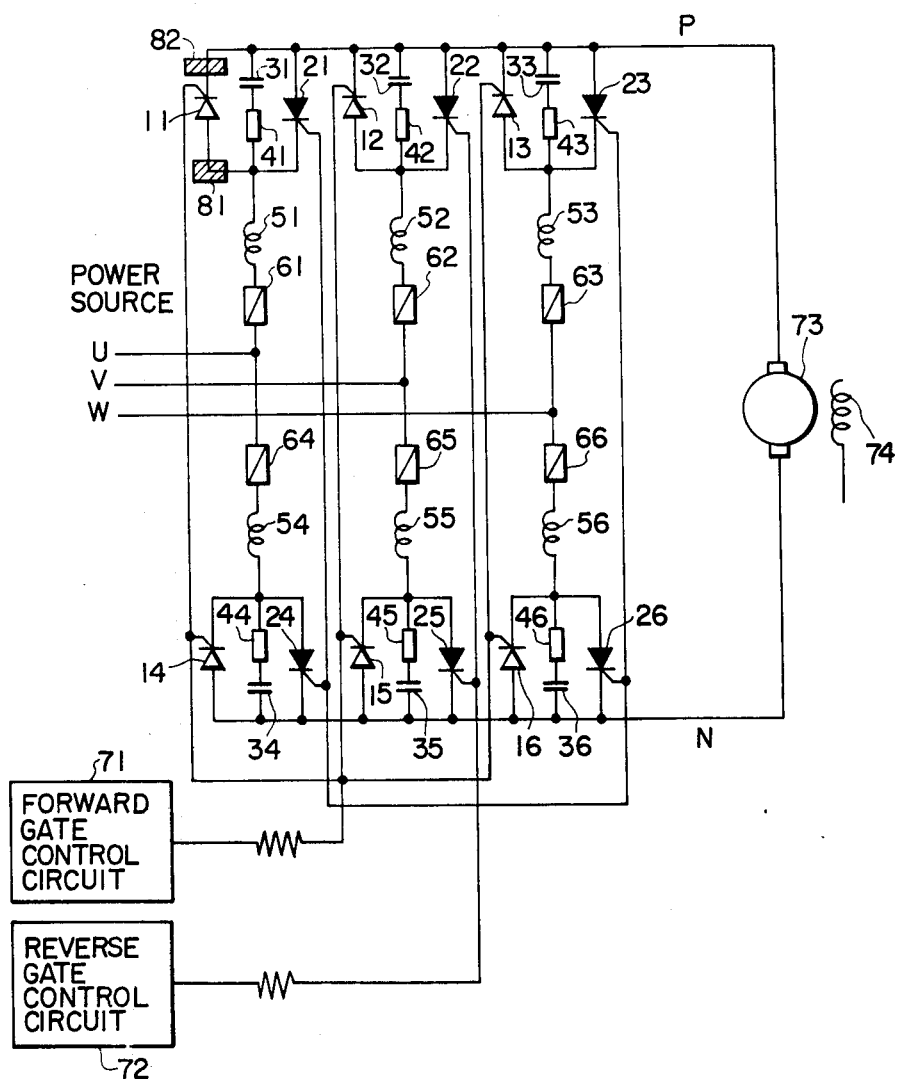
FIGS. 1a and 1b show a conventional converter circuit arrangement with the cooling fins for the thyristor elements being attached thereto in accordance with the prior art.
Figure 1B:
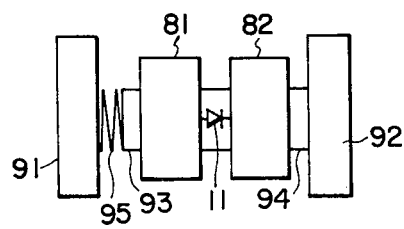
Figure 2A:
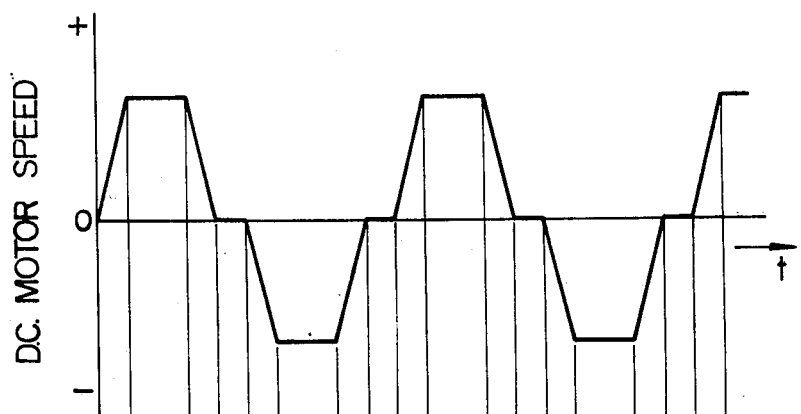
Figure 2B:
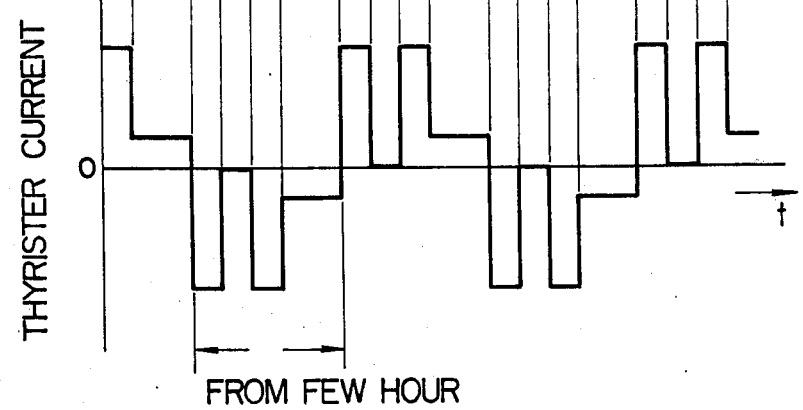

For purposes of simplification, the same reference numerals for corresponding elements as those shown in FIGS. 1a and 1b are employed in FIGS. 3a– 6b.

Figure 3A:
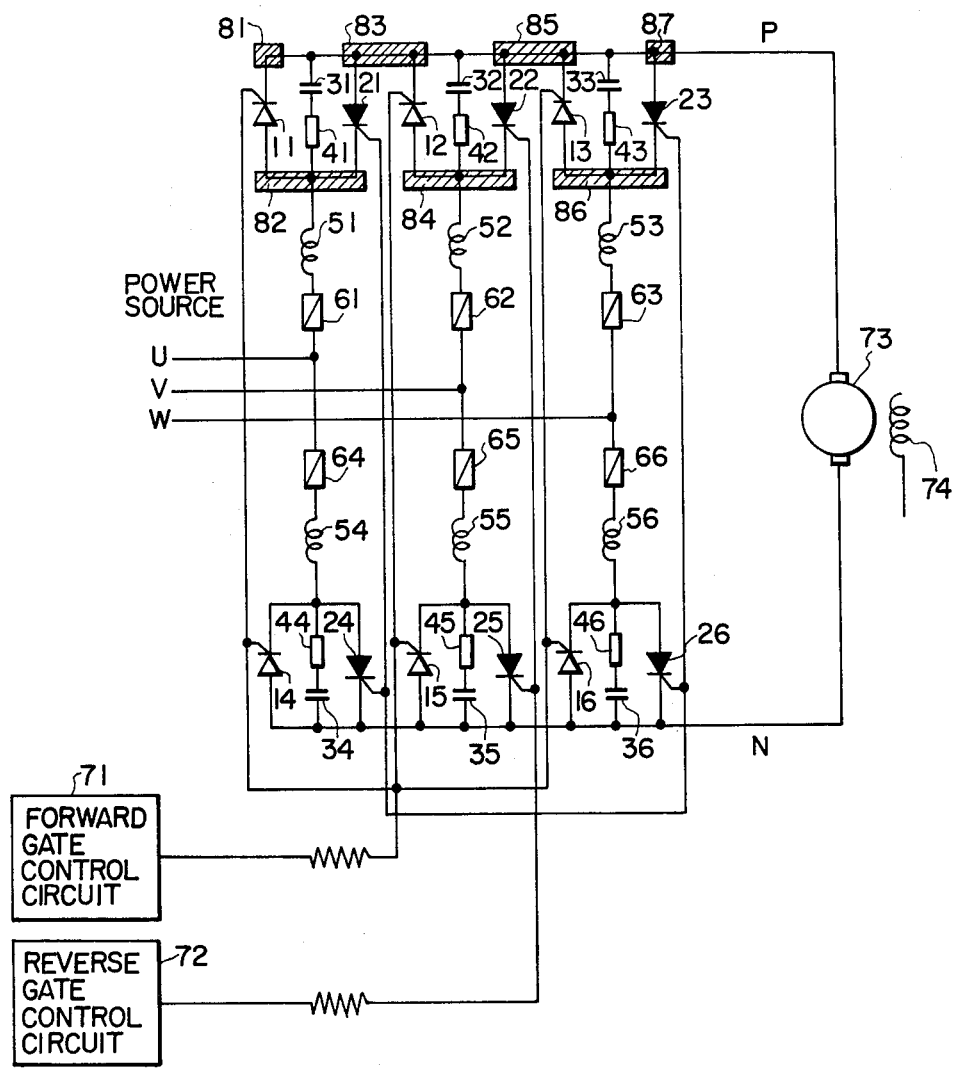
FIGS. 3a– 6b illustrate various embodiments of the present invention.

Referring now to FIG. 3a, semiconductor controlled rectifier elements 11 - 16, together with anode reactor elements 51 - 56, fuses 61 - 66, capacitors 31 - 36, resistor elements 41 - 46 and gate control circuits 71 and 72 constitute a converter for driving electric motor 73 having field winding 74. Power source lines U, V and W are connected to the fuses 61 through 66 in the same fashion shown in FIG. 1a. Thyristor groups 11 - 16 and 21 - 26, respectively, are appropriately gated for driving the motor 73 in the forward or reverse direction.

In accordance with the present invention, for the purposes of cooling the individual thyristor elements, cooling fins are employed in the manner shown in the upper portion of the Figure. Namely, cooling fins 82 - 86 are interposed between the opposing polarity electrodes of thyristors 11 - 21, thyristors 21 - 12, thyristors 12 - 22, thyristors 22 - 13 and thyristors 13 - 43, respectively. To the cathode of thyristor 11 cooling fin 81 is coupled and to the anode of thyristor 23 cooling fin 87 is coupled. Of course, a similar arrangement is provided for thyristors 14 - 26 shown in the lower portion of FIG. 3a, the cooling fin arrangement being shown in-detail for only the upper portion of the Figure for purposes of simplifying the illustration.

Figure 3B:
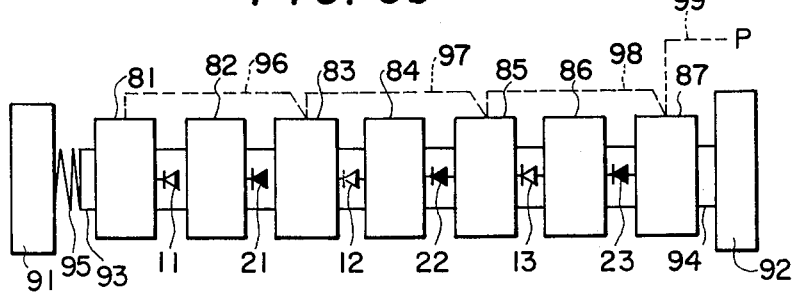

The physical layout of the individual thyristors is shown in FIG. 3b, wherein mutual cooling fins 82 - 86 are disposed to cool respective anode-cathode pairs of aligned thyristors 11 - 23, while individual cooling fins 81 and 87 are disposed at the end of the stack. The thyristor elements and the cooling fins, so arranged in the stack are further provided with insulators 93 and 94 and a spring 95 and are supported by conductors 91 and 92. In this arrangement, with the anode reactor elements 51 – 56 being disposed on the A.C. power supply of the bridge circuits, the cooling fins are interposed along the same axis and in series with the semiconductor controlled rectifier elements as described above.

Figure 4A:
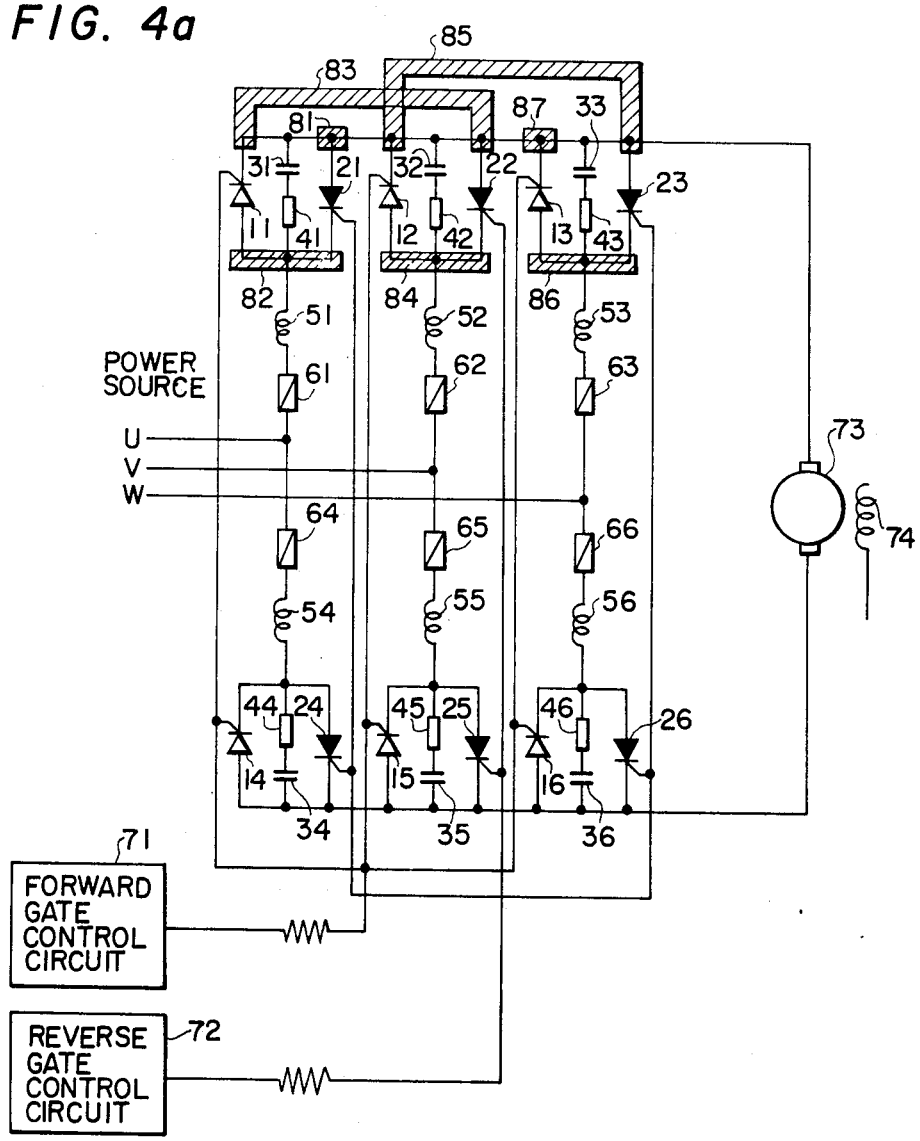
Figure 4B:
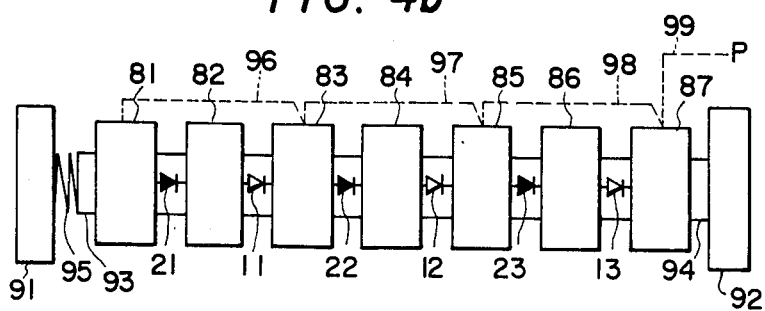

A further embodiment of the invention is shown in FIGS. 4a and 4b, in which the circuit configuration shown in FIG. 4a is the same as that in FIG. 3a, yet the cooling fins 81, 83, 85 and 87 are transposed as shown in the upper portion of FIG. 4a so that, between the successively stacked cooling fins 81–87, shown in FIG. 4b, the arrangement of the thyristor elements themselves will be different from that shown in FIG. 3b. Still, the intended mutual cooling effect obtained in the circuit configuration shown in FIGS. 3a and 3b is obtained for the configuration shown in FIGS. 4a and 4b.

Figure 5A:
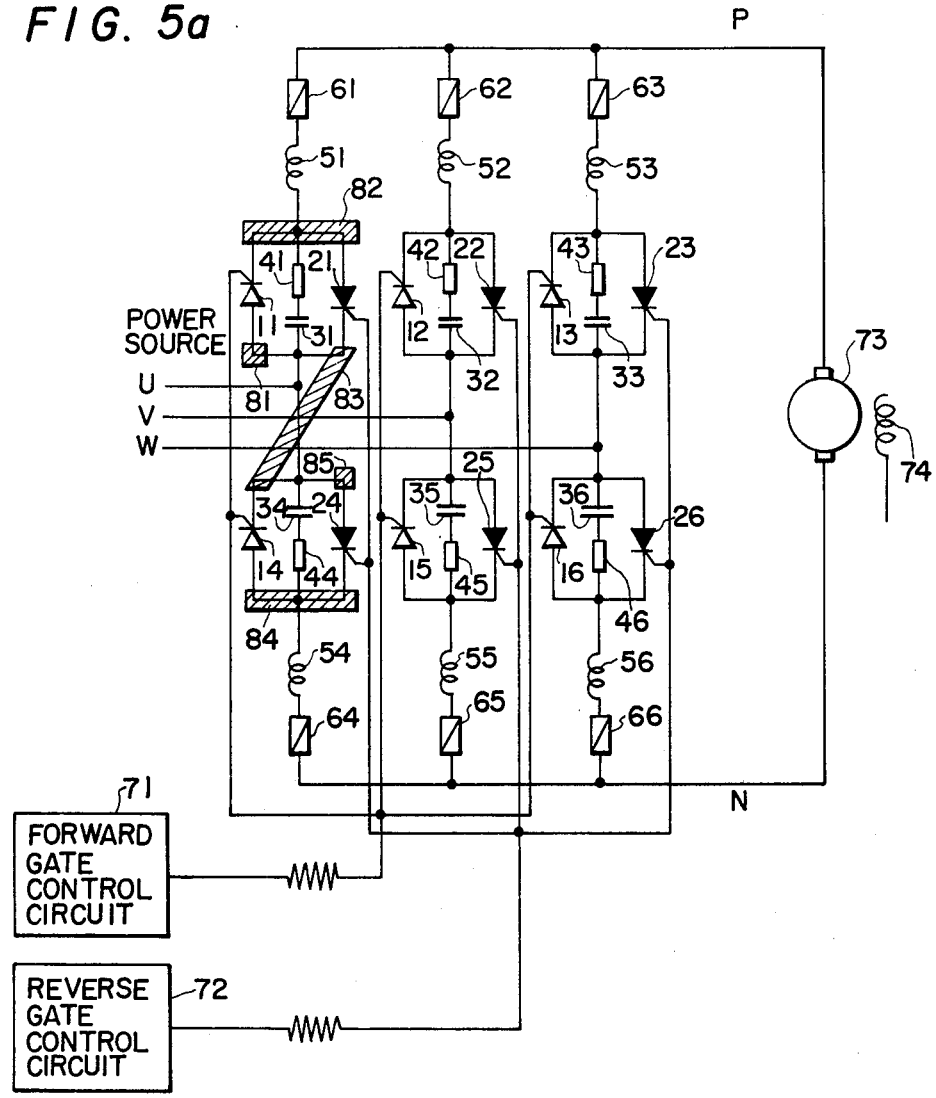

FIG. 5a illustrates an embodiment of the invention wherein the anode reactor elements 51 – 56 are incorporated on the side of the load for the converters, namely, connected directly to the line to which the motor 73 is connected. Albeit cooling fins 81 – 85 are shown for only a single phase U it will be understood that similar cooling fin arrangements are employed for the remaining phase lines V and W. Cooling fins 82, 83 and 84 are disposed to provide cooling for the mutually connected electrodes of thyristors 11 and 21, thyristors 21 and 14, and thyristors 14 and 24, respectively, while cooling fins 81 and 85 are associated with individual electrodes of thyristors 11 and 24, respectively. In this manner, the thyristors are stacked together with the cooling fins in the manner shown in FIG. 5b.

Figure 5B:
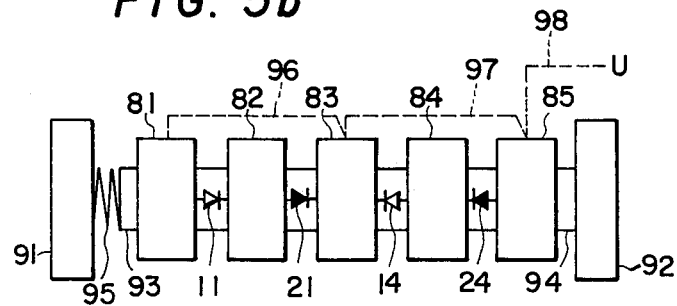
Figure 6A:
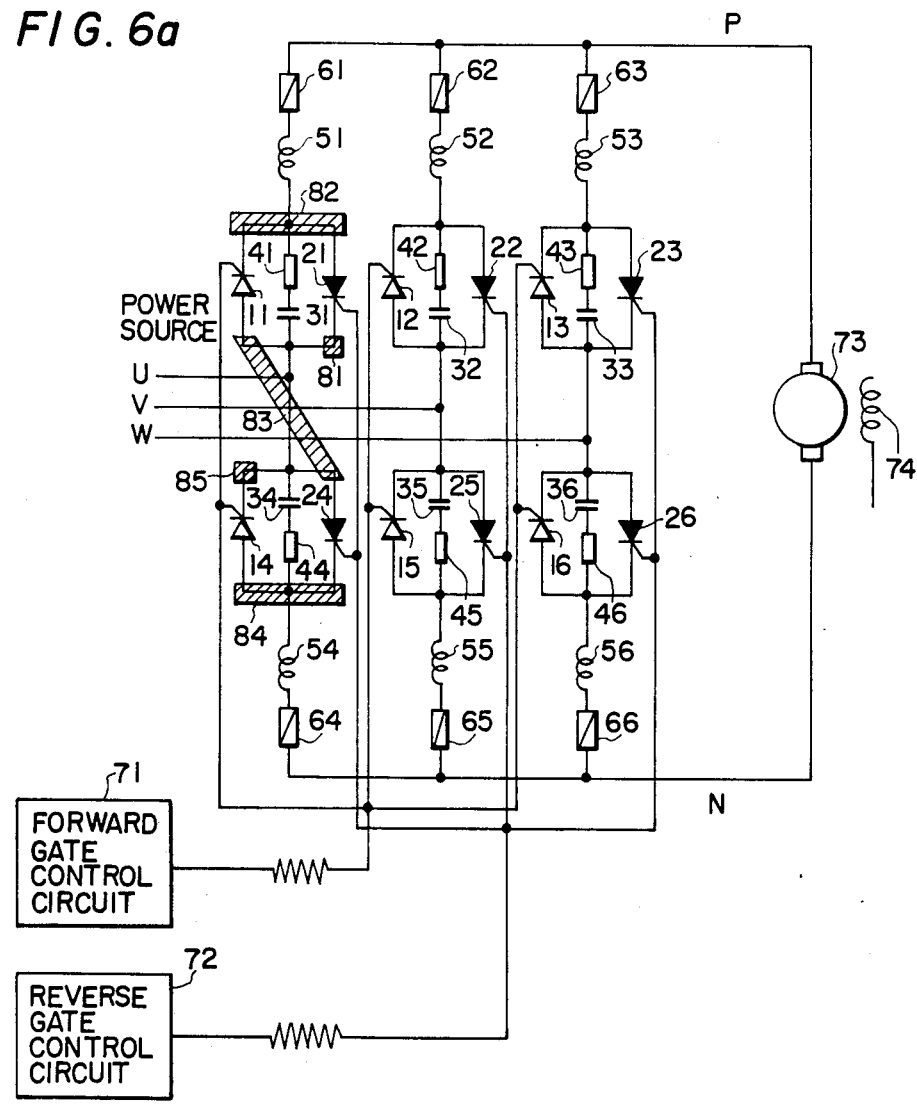
Figure 6B:
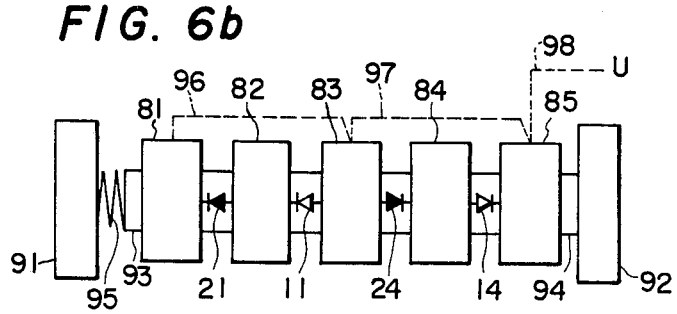

The configuration similar to that shown in FIGS. 5a and 5b is illustrated in FIGS. 6a and 6b, wherein relative to the cooling fins 81, 83 and 85, the positions of the thyristors 11, 21, 14 and 24 is switched, as can be seen from a comparison of FIGS. 5b and 6b.

Of course, albeit the reactor and fuse elements 51 – 56 and 61 – 66 have been illustrated in each of the circuits shown, they may be omitted in certain instances.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. In a converter circuit having two sets of converters, each including planar-type semiconductor controlled rectifier elements, connected in a bridge configuration, said converters being connected in parallel, with opposite polarities, to a load, an improved cooling arrangement for said converters wherein
said rectifier elements are aligned in sequence along an axis so that the adjacent electrodes of adjacent rectifier elements which belong to respectively different converters are of opposite polarities with respect to each other; and
cooling elements are interposed between each pair of adjacent rectifier elements wherein cooling elements are interposed between each adjacent rectifier element in said sequence.

2. In a multiphase converter circuit having two sets of converters, each including planar-type semiconductor controlled rectifier elements, connected in a bridge configuration, said converters being connected in parallel, with opposite polarities, to a load, and wherein anode reactor elements are connected between power supply lines for said circuit and said controlled rectifier element, an improved cooling arrangement for said converters wherein
the rectifier elements disposed between each respective load terminal and associated anode reactor elements are aligned in sequence along an axis so that the adjacent electrodes of adjacent rectifier elements which belong to respectively different converters are of opposite polarities with respect to each other; and
cooling elements are interposed between each pair of adjacent rectifier elements.

3. In a multiphase converter circuit having two sets of converters, each including planar-type semiconductor controlled rectifier elements, connected in a bridge configuration, said converters being connected in parallel, with opposite polarities, to a load, and wherein anode reactor elements are connected between said controlled rectifier elements and said load, an improved cooling arrangement for said converters wherein
the rectifier elements associated with each respective phase are aligned in sequence along an axis; and
cooling elements are interposed between adjacent rectifier elements which belong to respectively different converters and the adjacent electrodes of which are of opposite polarities with respect to each other.

4. In a multiphase converter circuit according to claim 3, wherein cooling elements are interposed between each adjacent rectifier element in said sequence.

* * * * *